(12) United States Patent
Mann

(10) Patent No.: US 6,617,562 B1
(45) Date of Patent: Sep. 9, 2003

(54) CMOS IMAGER WITH DISCHARGE PATH TO SUPPRESS RESET NOISE

(75) Inventor: Richard A. Mann, Torrance, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/680,037

(22) Filed: Oct. 5, 2000

(51) Int. Cl.$^7$ ................................................ H01L 27/00
(52) U.S. Cl. .............................. 250/208.1; 250/214 R; 257/290; 257/291
(58) Field of Search ...................... 250/208.1, 214 R; 348/314, 299; 257/290, 291, 292; 326/81

(56) References Cited

U.S. PATENT DOCUMENTS 5,981,932 A * 11/1999 Guerrieri et al. ........ 250/208.1
6,271,553 B1 * 8/2001 Pan ............................ 257/291

* cited by examiner

Primary Examiner—Robert H. Kim
Assistant Examiner—Hoon Song

(74) Attorney, Agent, or Firm—Farjami & Farjami LLP

(57) ABSTRACT

An image sensor having a photo-detector and a reset contact that are electrically connected by a discharge path disposed between the reset contact and the photo-detector. The photo-detector has a depletion region for receiving and collecting radiation charges that are discharged through the discharge path to the reset contact. In one implementation, the reset of the photo-detector to a known potential is achieved by applying a high reset voltage to the reset contact that causes a reset depletion region to form beneath the reset contact. The outer perimeter of the reset depletion region defines a reset junction. The reset junction and the photo-detector junction are of the same polarity. As the high reset voltage is increased at the reset junction, the reset depletion region merges via punch through with the photo-detector's depletion region to create the discharge path. The voltage on the reset contact is increased beyond the expected potential of the photo-detector so that a potential difference is established across the discharge path and charges are swept away from the photo-detector via the discharge path. At the end of the reset, the potential on the reset junction is reduced and the depletion regions separate and the photo detector is left with a fixed potential. In this manner the kTC noise associated with the reset through a MOSFET switch is eliminated as the charge is transferred through the merging of two depletion areas.

37 Claims, 8 Drawing Sheets

CMOS IMAGER WITH DISCHARGE PATH TO SUPPRESS RESET NOISE

BACKGROUND OF THE INVENTION

1. Technical Field

This invention relates generally to electronic imaging devices and, in particular, to an electronic imaging device that suppresses reset noise in an image sensor.

2. Related Art

Photosensor image processing in camera and video systems commonly utilize CMOS image sensors that have cost and power advantages over other technologies such as charge coupled devices (CCD). A conventional CMOS image sensor has a photo-detector that is reset to a known potential after the readout of each image by a NMOS FET acting as a reset switch. When the NMOS FET reset switch is "switched off," charge left in the NMOS FET channel drifts back to the photo-detector and produces reset noise. A common measure of reset noise is the product of the Boltzman's constant "k", temperature "T", and capacitance "C" (typically known as kTC) and represents an uncertainty about the voltage on the photo-detector following a reset.

CMOS imager sensors typically utilize off-chip signal processing to improve signal to noise (S/N) performance and compensate for the reset noise generated by a conventional NMOS FET acting as a reset switch. In addition, utilization of a conventional NMOS FET as a reset switch adds a significantly large capacitance component to the photodiode because of the FET's moderately doped p-well being in direct contact with the more heavily doped drain implant. This increased capacitance results in a loss of sensitivity in the CMOS image sensors.

Additionally, the sub-micron fabrication technology utilized in conventional NMOS FET fabrication is not optimized to reduce junction leakage. Junction leakage in a MOS FET results from an increased electric field associated with a shallow junction, Arsenic implant damage, and gate induced drain leakage. Furthermore, when the gate threshold is too low, which is the typical case for the conventional sub-micron NMOS FET, continuous soft resets results due to sub-threshold leakage. Junction leakage associated with poor junction optimization and continuous soft resets in a CMOS image sensor contribute to reset noise and a loss of sensitivity at low light levels. What is needed in the art is an approach to reduce reset noise, typically the dominant source of noise, in CMOS imager sensor without reducing the area available for light collection.

SUMMARY

A CMOS imager with a discharge path to suppress reset noise is provided. The CMOS imager has a discharge path and a reset contact electrically connected to the photo-detector. The discharge path may enable charge flow between the reset contact and the photo-detector. The CMOS image sensor suppresses reset noise by utilizing an image sensor that has a discharge path, rather than utilizing a conventional CMOS device, such as a NMOS FET, as a reset switch.

The reset of a photo-detector to a known potential is achieved by applying a high reverse bias to a reset node that is in close proximity to the photodiode junction. The reset node junction and the photodiode junction are of the same polarity. As the bias is increased, the depletion regions of the reset junction and the photodiode junction merge to establish a common potential. The potential on the reset junction is removed and the depletion regions separate at the end of the reset leaving the photodiode in isolation as a reverse biased junction with a fixed potential. In this manner, the kTC noise associated with the reset through a NMOS FET reset switch is eliminated.

Other systems, methods features and advantages of the invention will be or will become apparent to one with skill in the art upon examination of the following figures and detailed description. It is intended that all such additional systems, methods features and advantages be included within this description, be within the scope of the invention, and be protected by the accompanying clams.

BRIEF DESCRIPTION OF THE FIGURES

The components in the figures are not necessarily to scale, emphasis instead being placed upon illustrating the principals of the invention. Moreover, in the figures, like reference numerals designate corresponding parts throughout the different views.

DETAILED DESCRIPTION OF THE PREFERRED EMBODIMENTS

Figure 1:
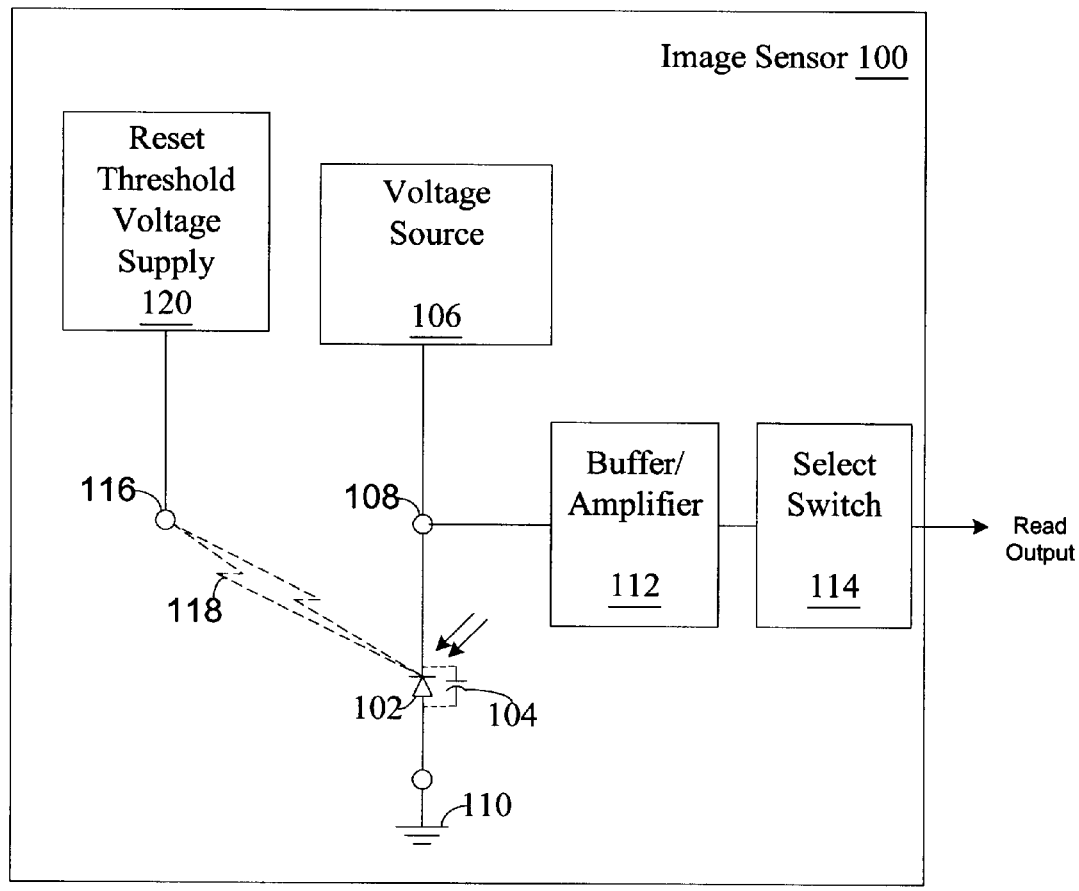
FIG. 1 is a block diagram illustrating an exemplary image sensor in accordance with an example implementation of the invention.

In FIG. 1, a block diagram depicting an image sensor 100 is illustrated. Image sensor 100 has a photodiode photo-detector 102 with a floating capacitive charge (shown as a capacitor 104). The photo-detector 102 is electronically connected to a voltage source 106 and a buffer/amplifier 112 at a terminal 108 and an electrical ground 110 at the other end of the photo-detector 102. The buffer/amplifier 112 is electrically connected to the terminal 108 and a select switch 114. A reset contact 116 is electrically connected to a reset threshold voltage supply 120. The output circuitry for the image processor, such as a buffer/amplifier 112 and a select switch 114 for accessing the photo-detector 102 during a read operation is shown, but a description of the operation of buffer/amplifier 112 and select switch 114 is not necessary for an understanding of the invention.

The image sensor 100 has a photo-detector 102, such as a photodiode, photogate, photocapacitor or other device that is capable of converting electromagnetic radiation into a signal. The photo-detector 102 converts received radiation charges into corresponding electrical signals that are read by an image processor (not shown). The capacitor 104 represents the floating capacitive charge that accumulates in the photo-detector 102 due to sensing radiation prior to a reset or a read operation. To facilitate receiving and collecting charges, the photo-detector 102 may be electrically connected to a voltage source 106, resulting in the photo-detector having a reverse bias.

Applying the reset threshold voltage 120 to the reset contact 116 creates the discharge path 118. The discharge path 118 is shown in FIG. 1 in phantom to denote that it is created during reset of the photo-detector 102, and not while the sensor 100 is being sampled or read. When created, the discharge path 118 is preferably disposed between the photo-detector 102 and the reset contact 116. In addition, the reset contact 116 is preferably disposed in close proximity to photo-detector 102 to limit the required reset threshold voltage level applied to the reset contact 116 to create the discharge path 118.

Figure 2:
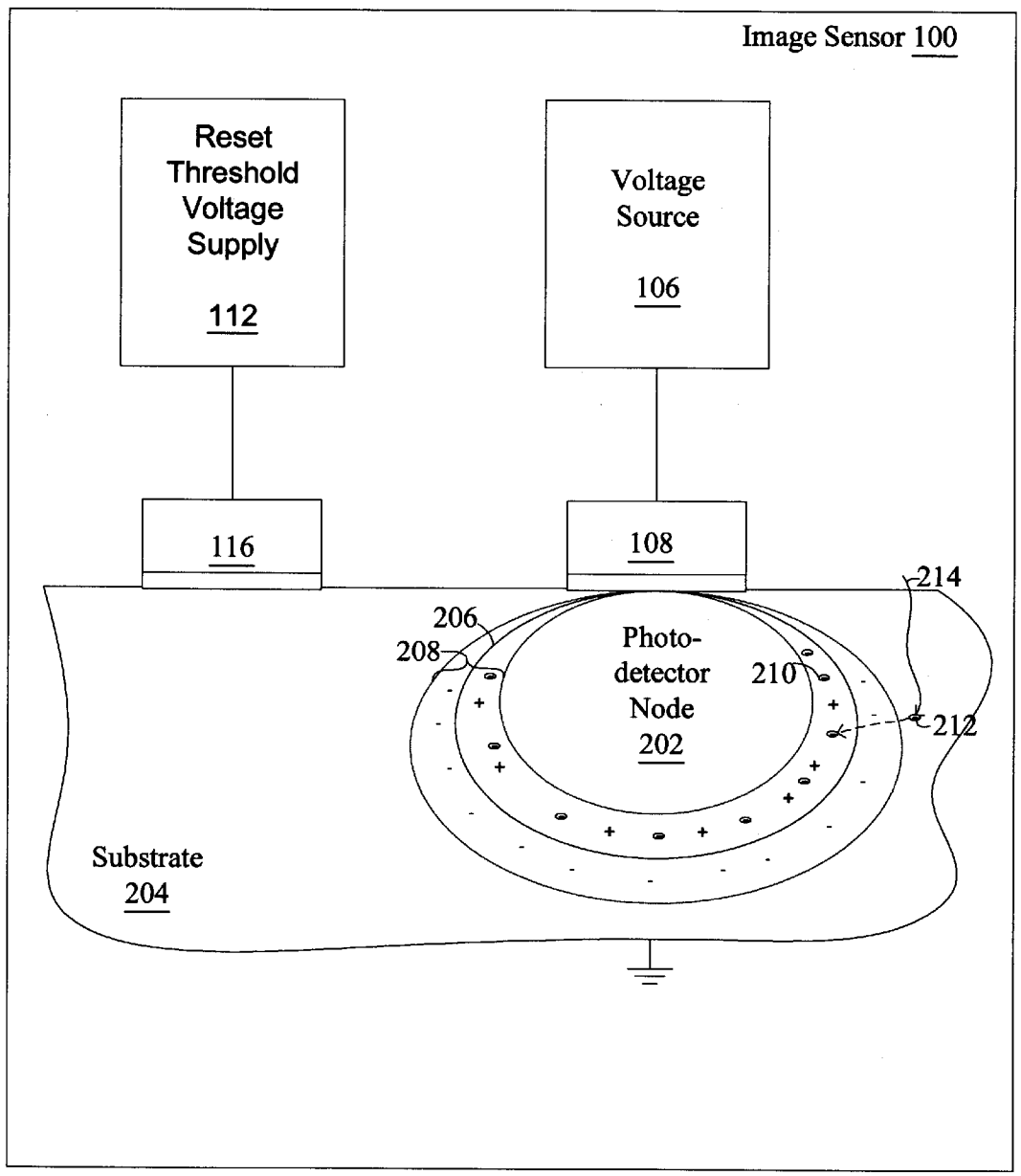
FIG. 2 is a cross sectional view of the exemplary image sensor of FIG. 1.

In FIG. 2, a cross sectional view of the image sensor 100 of FIG. 1 is shown. The photo-detector 102 (FIG. 1), includes a photo-detector node 202 (FIG. 2), formed with a substrate 204 and electrically connected to a voltage source 106 via terminal 108. A reset contact 116 is present and electrically connected to a reset threshold voltage supply 112. The photo-detector node 202 preferably has a polarity opposite the polarity of substrate 204 such that the photo-detector node 202 and the substrate 204 define a detector junction 206. The detector junction 206 has a depletion region 208 that is subject to an electric field based on the differing polarities of the photo-detector node 202 and the substrate 204. The electric field of the depletion region 208 is consistent with the reverse biasing potentials across the photo-detector 102 (FIG. 1). Radiation 214 (FIG. 2), that enters the depletion region 208 of the detector junction 206 creates charge carriers or electron-hole pairs 210 (only electrons shown for clarity) which are swept to one side of the depletion region 208 (e.g. electrons swept to positive side of electric field). A charge carrier 212 created when radiation is absorbed in the substrate 204, may diffuse to the depletion region 208 to also be collected by the photo-detector node 202.

Figure 3:
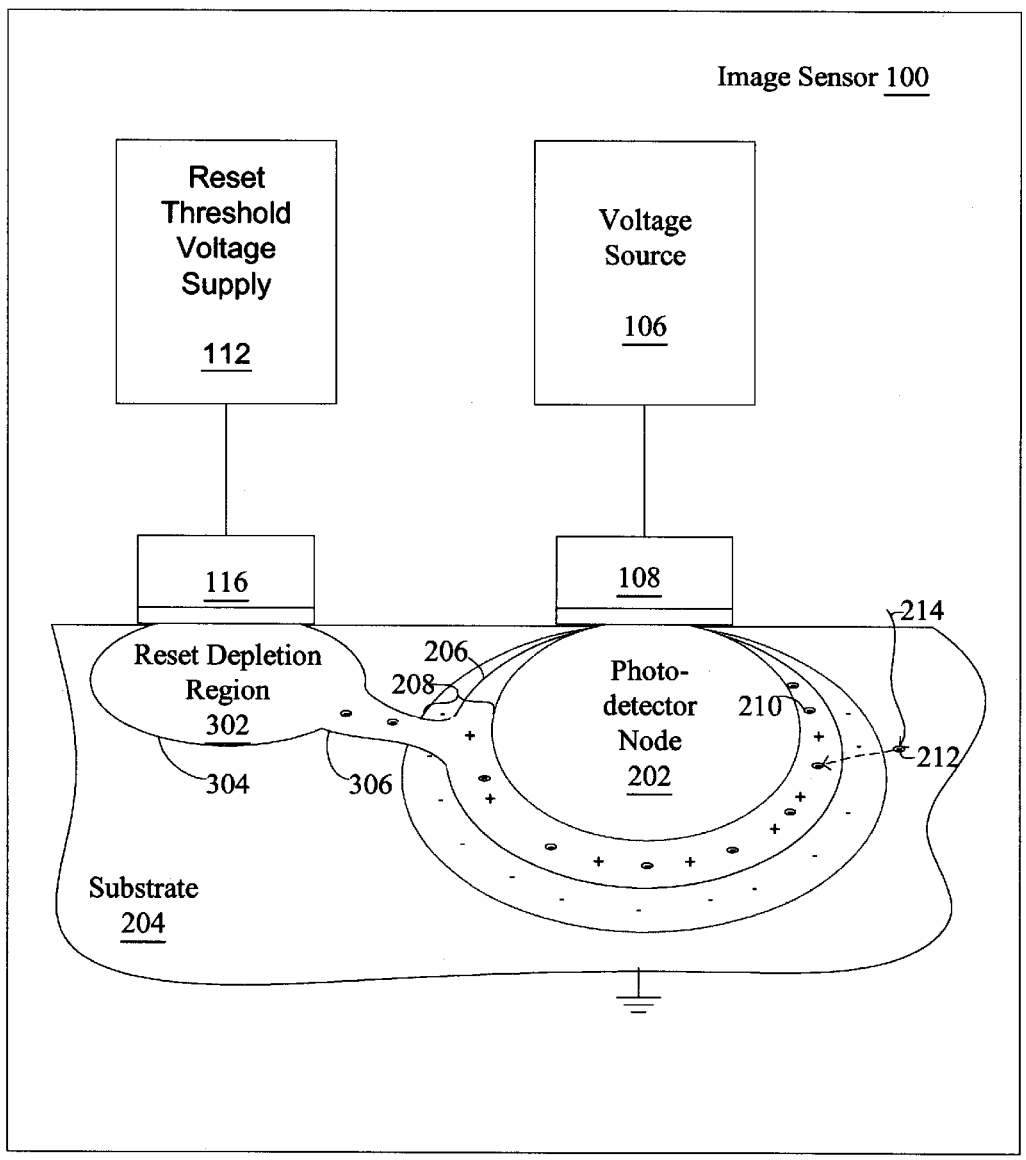
FIG. 3 is a cross sectional view of the exemplary image sensor in FIG. 1 during a reset operation.

FIG. 3, a cross sectional view of the image sensor 100 during a reset operation is shown. The reset threshold voltage from the reset voltage supply 112 is applied to the reset contact 116 having a polarity opposite to another polarity found in the substrate 204 underlying the reset contact 116. A reset depletion region 302 (e.g., majority carrier holes repelled by positive potential on reset contact 116 when substrate 204 is p-type semiconductor resulting in a low resistive path to the reset contact 116) forms beneath the reset contact 116. The outer perimeter of the reset depletion region 302 defines a reset junction 304. When the reset threshold voltage is increased to a predetermined level on reset contact 116, the reset depletion region 302 extends further into the substrate 204 to punch through or merge with the detector junction 206, creating the discharge path 306 between the reset contact 116 and the photo-detector node 202.

The photo-detector node 202 formed with the substrate 202 and electrically connected to the voltage source 106 via terminal 108 and detects radiation 214. The radiation 214 enters the depletion region 208 of the detector junction 206 resulting in charge carriers or electron-hole pairs 210 that end up in the depletion region 208. The accumulated charge, including charged carrier 212, collected by the photo-detector node 202 are released via the discharge path 306 through the reset contact 116.

Figure 4:
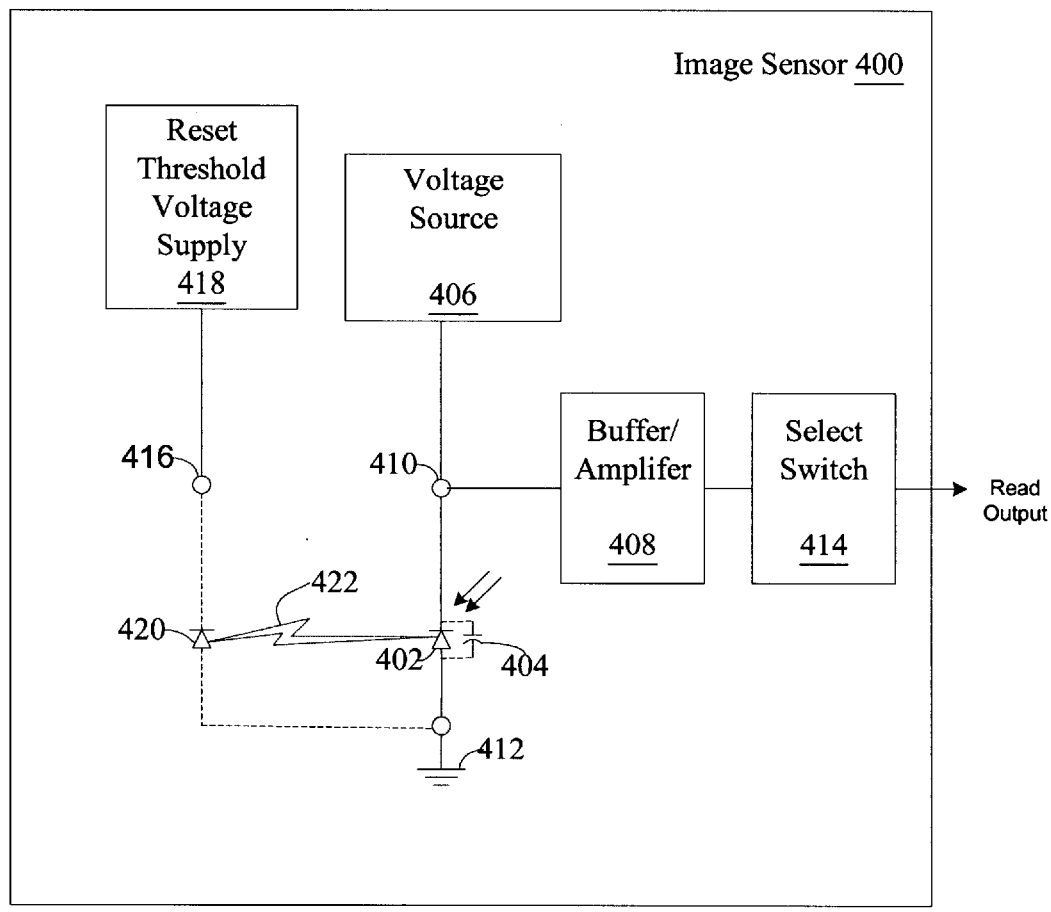
FIG. 4 is a cross sectional view of another exemplary image sensor.

In FIG. 4, an illustration of another embodiment of an image sensor 400 is shown. Image sensor 400 has a photo-detector 402 with floating capacitive charge (shown as a capacitor) 404. The photo-detector 402 is electrically connected to a voltage source 406 and a buffer/amplifier 408 at a terminal 410 and an electrical ground 412 at the other end of the photo-detector 402. The output circuitry for the image processor, such as a buffer/amplifier 408 and a select switch 414 for accessing the photo-detector 402 during a read operation is shown, but a description of the operation of buffer/amplifier 408 and select switch 414 is not necessary for an understanding of the invention. The buffer/amplifier 408 is electrically connected to the terminal 410 and a select switch 414. A reset contact 416 is electrically connected to a reset threshold voltage supply 418 and a reset implant 420. Upon application of the reset threshold voltage from 418 to the reset contact 416, a discharge path 422 is created. The discharge path 422 is shown in FIG. 4 in phantom to denote that it is created during reset of the photo-detector 402 and not while the sensor 400 is being sampled.

Figure 5:
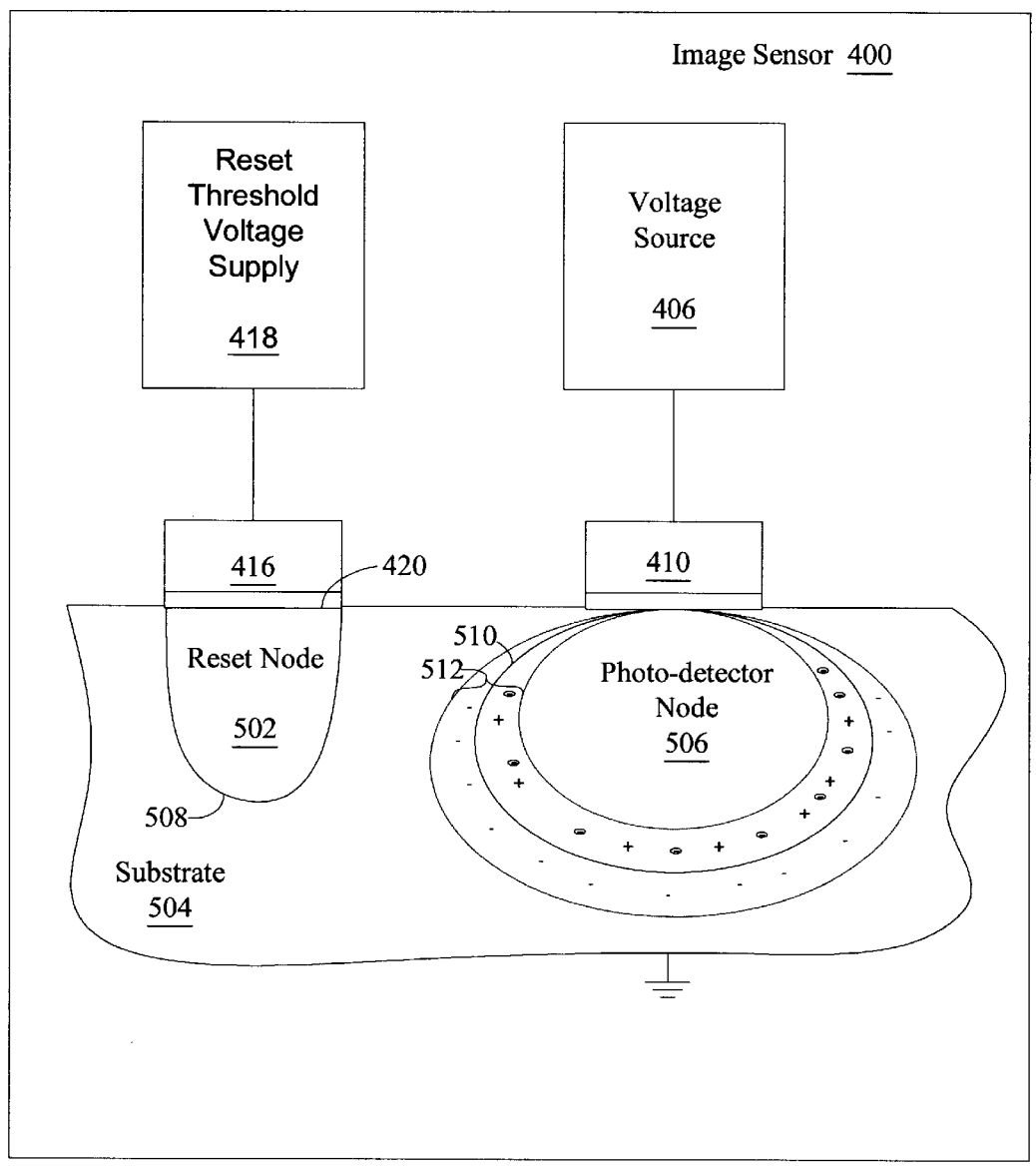
FIG. 5 is a cross sectional view of the exemplary image sensor depicted in FIG. 4.

In FIG. 5, a cross sectional view of the image sensor 400 is shown. The reset implant 420, preferably a diode, has a reset node 502 that is electrically connected to the reset contact 416. The reset node 502 is in the substrate 504 in close proximity to photo-detector node 506 enabling the discharge path 422 (FIG. 4), to be created between the reset node 502 (FIG. 5), and the photo-detector node 506 by applying the reset threshold voltage from the reset threshold voltage supply 418 to the reset contact 416. In the current implementation, the reset node 502 has a polarity that is opposite to the polarity of the substrate 504 such that the reset node 502 and the substrate 504 define a reset junction 508.

Substrate 504 preferably comprises a dopant level that is higher than a dopant level for the reset node 502 in order to provide a sufficient resistance between the reset node 502 and the photo-detector node 506 and electrically isolate one from the other. Thus, the reset implant 420 may be reversed bias or left floating while the reset threshold voltage from the reset threshold voltage supply 418 is applied to the reset contact 416. In either case, when a sufficient amount of charge carriers accumulates in the reset node 502, a discharge path 422 (FIG. 4), is created. The carriers diffuse to a portion of the substrate 504, shown in FIG. 5, as the region between the reset node 502 and the photo-detector node 506. The reset node 502 "punches" through the depletion region 512 (created around detector junction 510 and formed when voltage from the voltage source 406 is applied via terminal 410) to the photo-detector node 506 creating the discharge path 422 (FIG. 4). In this exemplary implementation of the invention, the substrate 504 (FIG. 5), has a p-type dopant while the reset node 502 and the photo-detector node 506 each has a n-type dopant. It is appreciated that the invention may also be implemented with a substrate having an n-type region and the reset node 502 with the photo-detector node 506 having a p-type region. In addition, the photo-detector node 506 is preferably more lightly doped then the substrate 504 to provide a sufficient resistance between the detector junction 510 and the reset node 502 requiring a significant reset threshold voltage level before the discharge path 422 (FIG. 4), is created. A significant reset threshold voltage limits the occurrence of a soft reset and thus an erroneous reading of the sensor.

Figure 6:
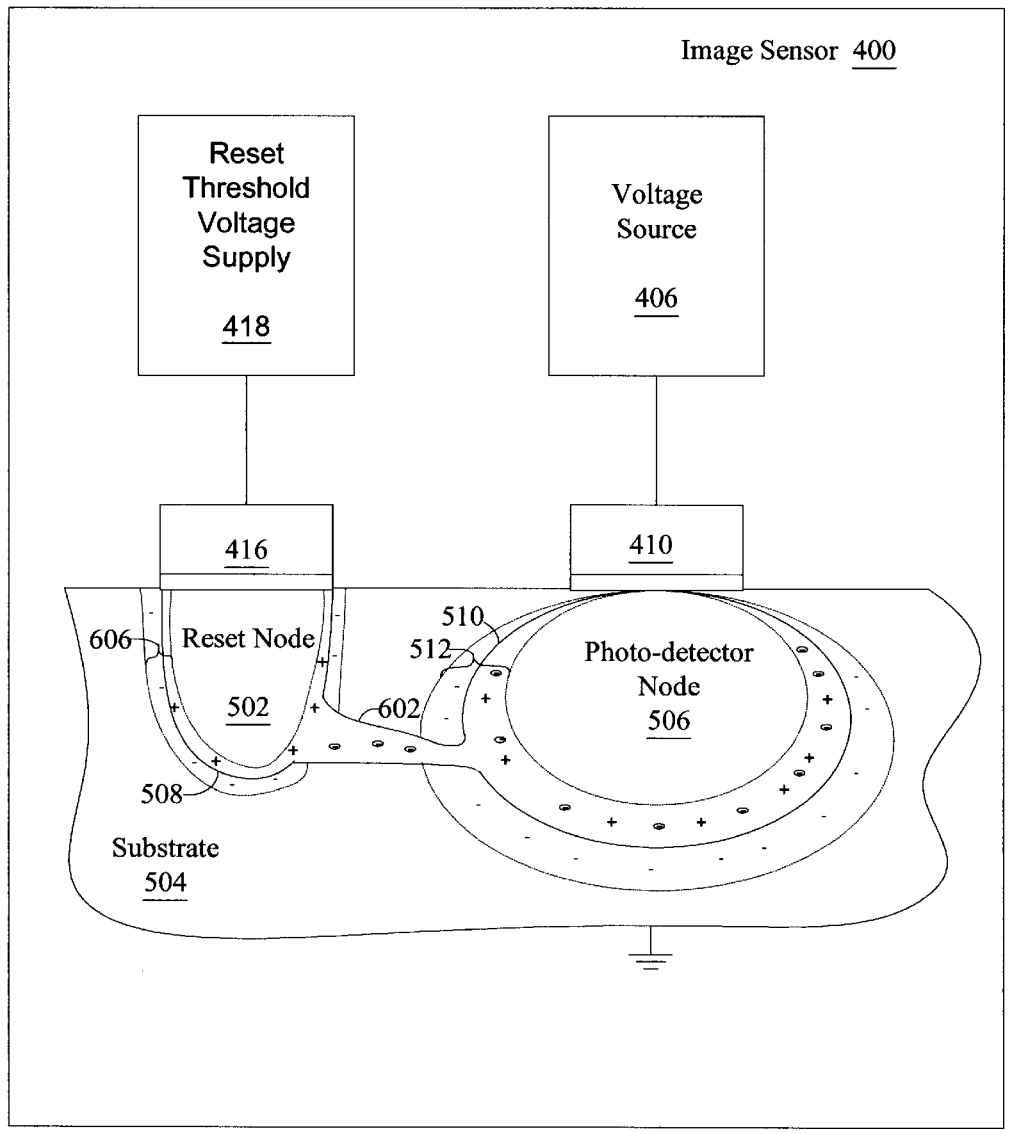
FIG. 6 is a cross sectional view of the exemplary image sensor of FIG. 4 during a reset operation.

In FIG. 6, a cross sectional view of the image sensor 400 during a reset operation is shown. A reset threshold voltage from the reset threshold voltage supply 418 is applied to the reset contact 416. In this instance, the discharge path 602 between the reset node 502 and the photo-detector node 506 is created and disposed between the detector junction 510 and the reset junction 508. When the reset threshold voltage from the reset threshold voltage supply 416 is increased to a predetermined level, the reset depletion region 606 extends further into the substrate 504 to punch through or merge with the depletion region 512. The depletion region 512 around the photo-detector node 506 is created by the voltage source 406 applying a voltage to terminal 410 that is electrically connected to the photo-detector node 506. The merging of the reset depletion region 606 and the depletion region 512 creates the discharge path 602 between the reset contact 416 and the photo-detector node 506. The discharge path 602 allows the accumulated charge on the photo-detector node 610 to be released through the reset contact 416.

Figure 7:
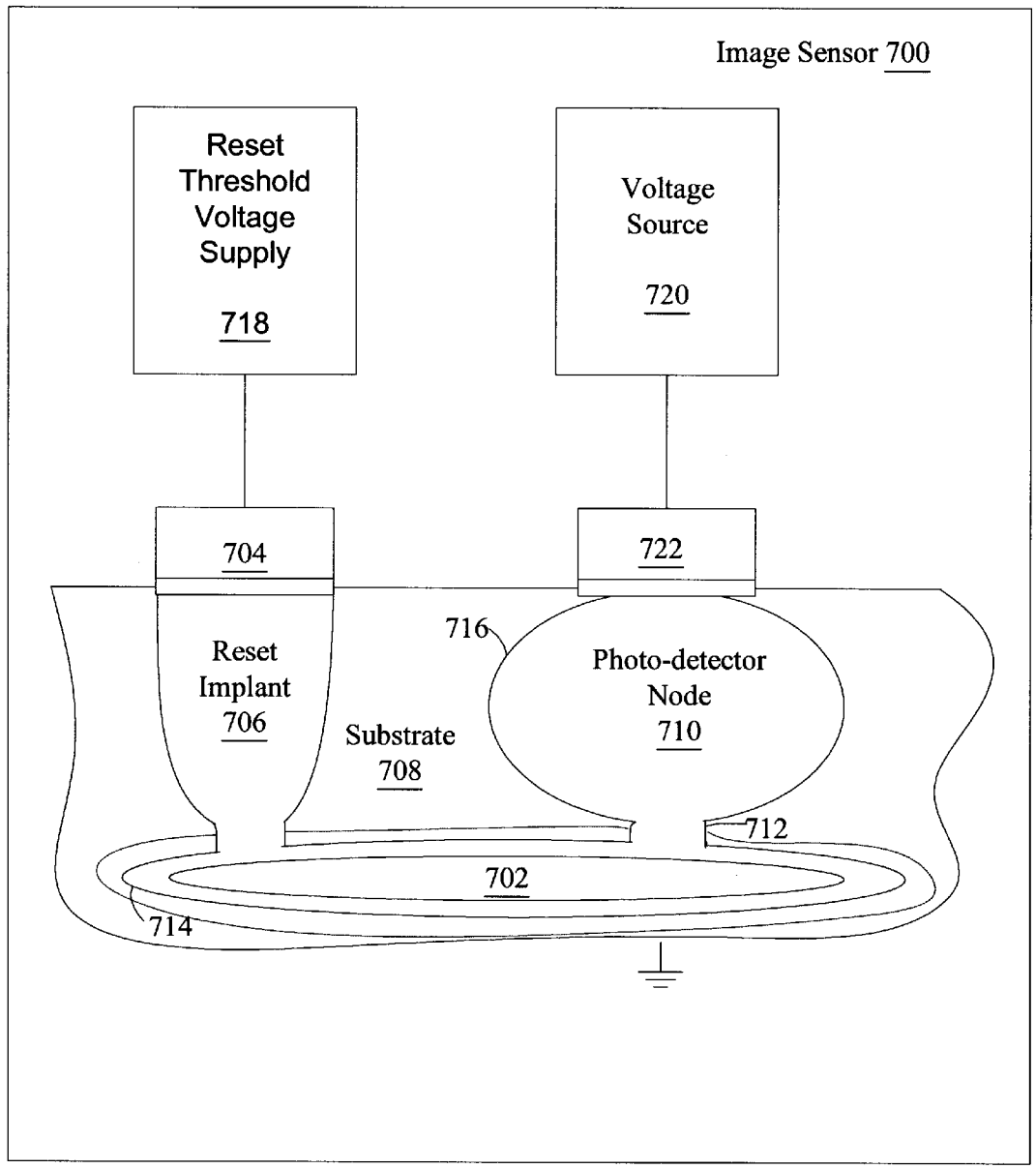
FIG. 7 is a cross sectional view of another exemplary image sensor.

In FIG. 7, a cross sectional view of yet another implementation of an image sensor 700 is shown. The image sensor 700 includes a reset strip 702, in lieu of a reset node 502 (FIG. 5), that is electrically connected to the reset contact 704 (FIG. 7), via a reset implant 706. The reset contact 704 is connected electronically to the reset threshold voltage supply 708 in addition to the reset implant 706. The photo-detector node 710 is connected electronically to a voltage source 720 by a terminal 722. The reset strip 702 is disposed within the substrate 708 in close proximity to the photo-detector node 710. The discharge path 712 is created by applying the reset threshold voltage from the reset threshold voltage supply 718 to the reset contact 704. The reset strip 702 is preferably buried below the photo-detector node 710. It is appreciated by one skilled in the art that in an alternative implementation an epitaxial layer that has properties similar to the substrate 708 may be grown over the reset strip 702 during fabrication to bury the reset strip 702 below the photo-detector element 710. Thus, the substrate 708 and epitaxial layer may be utilized interchangeably without limiting the invention.

To facilitate creation of the discharge path 712, the reset strip 702 has a polarity that is opposite to the polarity of the substrate 708 so that the reset strip 702 and the substrate 708 define a reset junction 714. In this instance, the discharge path 712 is disposed between the detector junction 716 and the reset junction 714. The substrate 708 preferably has a dopant level that is higher than a dopant level in the reset strip 702 to provide a sufficient resistance between the reset strip 702 and the photo-detector node 710 to electrically isolate one from the other. Thus, the reset strip 702 may be reversed bias or left floating while the reset threshold voltage from the reset threshold voltage supply 718 is applied to the reset contact 704. Again, when a sufficient amount of charge carriers accumulates in the reset node 706 to diffuse a portion of the substrate 708 region between the reset strip 702 and the photo-detector node 710, the reset strip 702 "punches" through the region to the photo-detector node 710 creating the discharge path 712.

In an exemplary implementation of the invention, the substrate 708 also has a p-type dopant while the reset strip 702 and the photo-detector node 710 each has a n-type dopant. It is contemplated that the invention could be accomplished with a substrate having an n-type region and the reset strip 702 and the photo-detector node 710 having a p-type region. In addition, the photo-detector node 710 is preferably more lightly doped then the substrate 708 to provide a sufficient resistance between the respective junctions such that a significant reset threshold voltage level applied at the reset threshold voltage supply 718 is required before the discharge path 710 is created.

The sensor 700 may also comprise a plurality of photo-detector nodes 710. In the implementation shown in FIG. 7, each one of the plurality of the photo-detector node 710 is electrically associated with the reset strip 702 such that a single reset may be performed on a corresponding row or column of photo-detector nodes 710 of sensor 700. Therefore, a sensor fabricated in accordance with this invention may yield higher fill factor as more sensors may be accommodated on the same size die.

Figure 8:
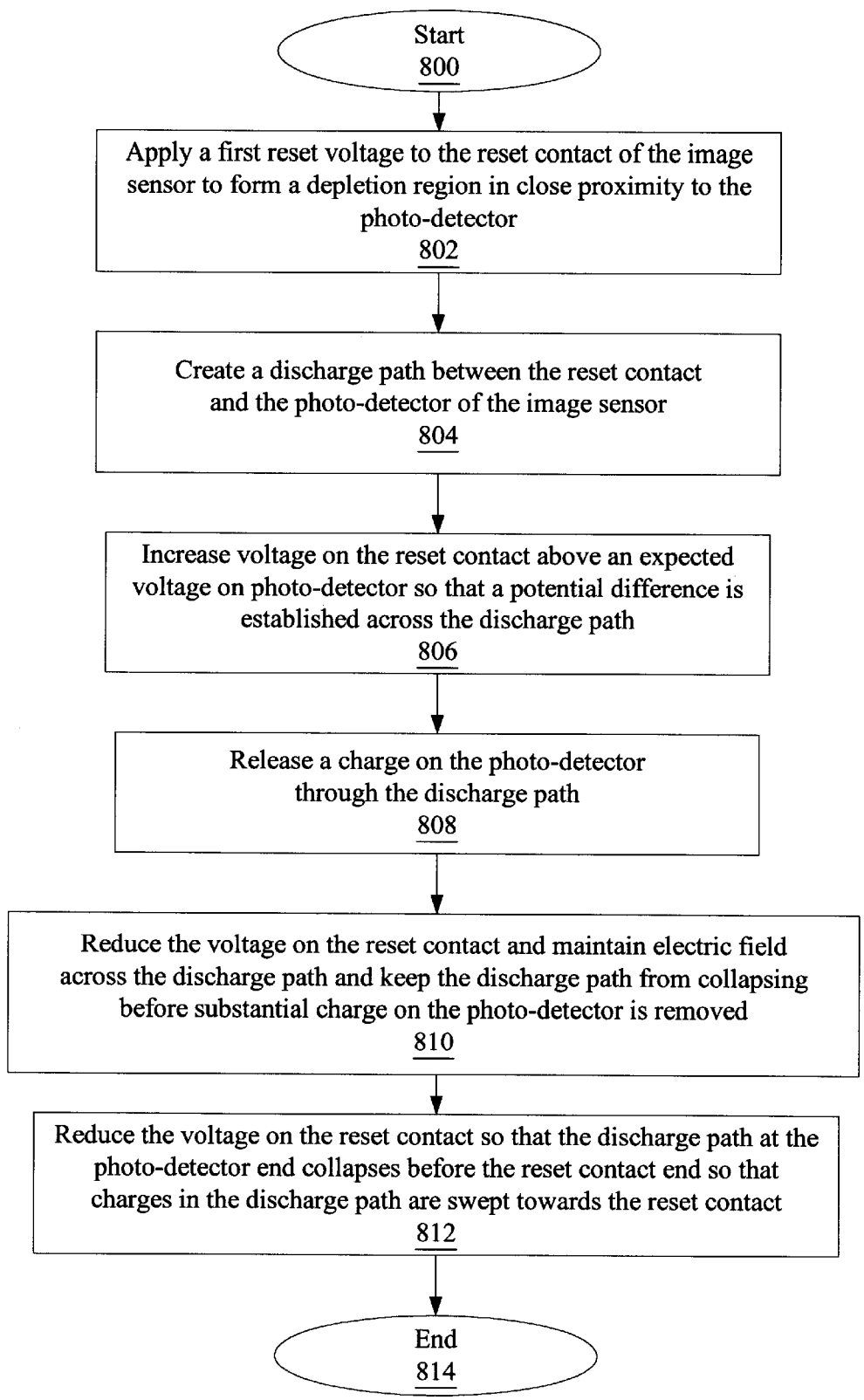
FIG. 8 is a flow chart illustrating an exemplary image sensor reset process.

In FIG. 8, a flow chart of an exemplary image sensor reset process is shown. The process starts 800 when a first reset threshold voltage from the reset threshold voltage supply 112 (FIG. 3), is applied 802 (FIG. 8), to the reset contact 116, of the image sensor 100. The application of the reset threshold voltage results in the creation of discharge path 306 between the reset depletion region 302 and the photo-detector node 202 of the image sensor 100. The charge on the photo-detector node 202 (FIG. 3), is released 806 (FIG. 8), through the discharge path 306 (FIG. 3). Because a conventional NMOS FET reset switch is not being utilized to perform the reset or drain the charge on the respective photo-detector, there is no random noise component associated with a NMOS FET reset switch, such as a large drain/channel capacitance that prevents a more complete discharge of the photo-detector. Therefore, the typical need to perform a correlated double sampling for each read operation to eliminate the respective contribution to reset noise associated with the NMOS FET reset switch is eliminated. In other words, because the reset operation in accordance with the invention is not susceptible to the thermal or temporal factors that create the uncertainty as to the level of voltage remaining on the photo-detector node 202 following a reset is substantially reduced. Once the image sensor 100 is reset once and then read once to determine the residual charge on the photo-detector node 202 following a reset, the residual charge can be stored and utilized thereafter as an offset correction to a read operation. Alternatively, an imager using image sensor 100 may perform uncorrelated double sampling to correct for any predicable residual offset voltage following a read of sensor 100.

The reset operation may also include applying a second reset threshold voltage 806 (FIG. 8), from the reset threshold voltage supply 112 (FIG. 3), to the reset contact 116 to allow the photo-detector node 202 to reach or exceed substantially the same voltage potential as the reset contact 116. The potential increases on the reset junction 206 (FIG. 3), independently of the photo-detector node 202 at the start. As the potential on this reversed biased junction increases, the depletion region 302 extends further into the substrate 204 until the depletion regions of the reset junction 302 and the detector junction 208 merge via punch through. At this point the potentials on the reset junction 304 and detector junction 208 rapidly reach equilibrium. Since there are variations in alternative embodiments having a reset node 502 (FIG. 5), or reset strip 702 (FIG. 7), the spacing and the doping of the reset node 502 (FIG. 5), or reset strip 702 in the alternate embodiments, the exact voltage at which junctions will merge vary with fabrication. Therefore, the potential on the reset contact is preferably increased beyond the minimum required for the depletion regions to merge 806 (FIG. 8), to ensure that the potentials reach equilibrium. Upon the depletion regions merging, a charge on the photo-detector node 202 (FIG. 3), is swept through the discharge path 306, towards the reset contact 116 in 808 (FIG. 8). The potential on the reset contact 116 (FIG. 3), is lowered to maintain the electric field across the discharge path 306 and prevent the discharge path 306 from collapsing before the charge on the photo-detector mode 202 is substantially removed 810 (FIG. 8). The voltage on the reset contact is reduced so the discharge path 306 at the photo-detector node 202 end collapses before the reset contact 116 end and charges in the discharge path 306 are swept towards the reset contact 116 in 812 (FIG. 8). The potential that remains on the photo-detector after the discharge path collapses is equal to the potential at which the depletion regions separate and processing ends 814. It is contemplated that the potential remaining on the photo-detector may be at or near zero voltage such that the reset results in a complete discharge. Alternatively, the potential remaining on the photo-detector node 202 may be an offset that is significant enough to effect the dynamic range of an imager utilizing image sensor 100 but still providing the advantage of increased sensitivity as the uncertainty of reset noise is substantially suppressed. In an alternate embodiment where the image sensor has a reset node 502 (FIG. 5), or a reset strip 702 (FIG. 7), the reset contact 116 may be grounded to avoid soft resets. The processing ends 814 upon the discharge path collapses.

While various embodiments of the invention have been described, it will be apparent to those of ordinary skill in the art that many more embodiments and implementations are possible that are within the scope of this invention.

What is claimed is:

1. An image sensor comprising:
    a photo-detector including:
        a photo-detector node having a first polarity; and
        a substrate having a second polarity opposite to the first polarity of the photo-detector node;
    a reset contact electrically connected to the photo-detector;
    a discharge path that enables charge flow between the reset contact and the photo-detector; and
    a reset implant within the substrate electrically connected to the reset contact.

2. The image sensor of claim 1, wherein the discharge path is created by application of a reset threshold voltage to the reset contact.

3. The image sensor of claim 2, wherein the reset contact is disposed in close proximity to the photo-detector that enables creation of the discharge path upon application of the reset threshold voltage to the reset contact.

4. The image sensor of claim 1, further includes a detector junction formed by the photo-detector node being in contact with the substrate.

5. The image sensor of claim 1, wherein a voltage polarity associated with the reset threshold voltage has the polarity of the photo-detector node.

6. The image sensor of claim 1, wherein the reset implant is disposed beneath the reset contact in proximity to the photo-detector node of the photo-detector that enables the discharge path to be created upon application of the reset threshold voltage to the reset contact.

7. The image sensor of claim 6, wherein the reset implant has an implant polarity opposite the second polarity of the substrate.

8. The image sensor of claim 7, wherein a reset junction is defined by the reset implant and the substrate.

9. The image sensor of claim 8, wherein the discharge path is disposed between the detector junction and the reset junction.

10. The image sensor of claim 7, wherein the reset implant is reversed biased.

11. The image sensor of claim 7, wherein the reset implant is left floating while the reset threshold voltage is applied to the reset contact.

12. The image sensor of claim 1, wherein a p-type dopant is present in the substrate.

13. The image sensor of claim 12, wherein a n-type dopant is present in the reset implant and the photo-detector.

14. The image sensor of claim 12, wherein the reset element is more heavily doped with the n-type dopant then the substrate with the p-type dopant and the photo-detector is more lightly doped with the n-type dopant then the substrate with the p-type dopant.

15. An image sensor comprising:
    a photo-detector;
    a reset contact electrically connected to the photo-detector;
    a discharge path that enables charge flow between the reset contact and the photo-detector; and
    a reset implant electrically connected to the reset contact and to the photo-detector.

16. The image sensor of claim 15, wherein a reset voltage is applied to the reset contact results in the discharge path.

17. The image sensor of claim 16, wherein the reset implant is disposed in close proximity to the photo-detector.

18. The image sensor of claim 17, wherein the photo-detector further includes a photo-detector node having a first polarity and a substrate having a second polarity opposite to the polarity of the photo-detector node.

19. The image sensor of claim 15, wherein the reset implant is a reset strip that is located in the substrate beneath the photo-detector.

20. The image sensor of claim 19, wherein the photo-detector is one of a plurality of photo-detectors.

21. The image sensor of claim 20, wherein the reset strip is located below the plurality of photo-detector.

22. The image sensor of claim 21, wherein each one of the plurality of the photo detector is electrically associated with the reset strip.

23. The image sensor of claim 19, wherein the reset strip has a strip polarity opposite a substrate polarity.

24. The image sensor of claim 23, wherein a reset junction is defined by the reset implant being in contact with the substrate.

25. The image sensor of claim 23, wherein the discharge path is disposed between the detector junction and the reset junction.

26. The image sensor of claim 23, wherein the reset implant is reversed biased.

27. The image sensor of claim 23, wherein the reset implant is floating upon application of the reset threshold voltage to the reset contact.

28. The image sensor of claim 19, wherein a p-type dopant is present in the substrate.

29. The image sensor of claim 28, wherein a n-type dopant is present in the reset strip and a n-type dopant is present in the photo-detector.

30. The image sensor of claim 29, wherein the reset strip is more doped with the n-type dopant then the substrate with the p-type dopant and the photo-detector is less doped with the n-type dopant then the substrate with the p-type dopant.

31. A method for resetting an image sensor that substantially avoids reset noise, the method comprising:
    applying a first reset voltage level to a reset contact of the image sensor; and
    creating a discharge path between the reset contact and a photo-detector having a charge in response to the application of the first reset voltage;
    transferring the charge on the photo-detector through the discharge path;
    increasing the voltage on the reset contact to a second reset voltage level;
    establishing a potential difference across the discharge path in response to the second reset voltage level; and reducing the second reset voltage on the reset contact at a rate sufficient to maintain the potential difference across the discharge path that prevents the discharge path from collapsing before the charge on the photo-detector is substantially removed.

32. The method of claim 31, wherein reducing voltage on the reset contact below the first reset voltage collapses the discharge path at a photo-detector end of the discharge path before the reset contact end of the discharge path, so that the charge that remains in the discharge path is swept towards the reset contact while a known potential remains on the photo-detector.

33. An image sensor comprising:

a photo-detector;

a reset contact electrically connected to the photo-detector;

means for enabling charge flow between the reset contact and the photo-detector; and a reset implant electrically connected to the reset contact and to the photo-detector.

34. The image sensor of claim 33, wherein the enabling means is created by application of a reset threshold voltage to the reset contact.

35. The image sensor of claim 34, wherein the reset contact is disposed in close proximity to the photo-detector that enables creation of the discharge path upon application of the reset threshold voltage to the reset contact.

36. The image sensor of claim 33, wherein the photo-detector further includes;

a photo-detector node having a first polarity, and a substrate having a second polarity opposite to the first polarity of the photo-detector node.

37. A system for resetting an image sensor that substantially avoids reset noise, the method comprising:

means for applying a first reset voltage level to a reset contact of the image sensor; and means for creating a discharge path between the reset contact and a photo-detector having a charge in response to the application of the first reset voltage;

means for transferring the charge on the photo-detector through the discharge path;

means for increasing the voltage on the reset contact to a second reset voltage level;

means for establishing a potential difference across the discharge path in response to the second reset voltage level; and means for reducing the second reset voltage on the reset contact at a rate sufficient to maintain the potential difference across the discharge path that prevents the discharge path from collapsing before the charge on the photo-detector is substantially removed.

* * * * *